United States Patent
Wu et al.

(10) Patent No.: US 11,441,553 B2
(45) Date of Patent: Sep. 13, 2022

(54) PIEZOELECTRIC DRIVING DEVICE

(71) Applicant: Koge Micro Tech Co., Ltd., New Taipei (TW)

(72) Inventors: Chung-Han Wu, New Taipei (TW); Jun-Yan Huang, New Taipei (TW); Hsin-Cheng Wang, New Taipei (TW)

(73) Assignee: KOGE MICRO TECH CO., LTD., New Taipei (TW)

( * ) Notice: Subject to any disclaimer, the term of this patent is extended or adjusted under 35 U.S.C. 154(b) by 436 days.

(21) Appl. No.: 16/535,095

(22) Filed: Aug. 8, 2019

(65) Prior Publication Data

US 2020/0052186 A1   Feb. 13, 2020

(30) Foreign Application Priority Data

Aug. 13, 2018   (TW) .................. 107128143

(51) Int. Cl.
| | |
|---|---|
| *H01L 41/04* | (2006.01) |
| *F04B 43/04* | (2006.01) |
| *H01L 41/047* | (2006.01) |
| *H01L 41/083* | (2006.01) |

(52) U.S. Cl.
CPC .......... *F04B 43/046* (2013.01); *H01L 41/042* (2013.01); *H01L 41/0475* (2013.01); *H01L 41/083* (2013.01)

(58) Field of Classification Search
CPC . H01L 41/042; H01L 41/0475; H01L 41/083; H01L 41/053
See application file for complete search history.

(56) References Cited

U.S. PATENT DOCUMENTS

| | | | |
|---|---|---|---|
| 4,417,170 A | 11/1983 | Benincasa | |
| 2004/0000843 A1 | 1/2004 | East | |
| 2015/0311423 A1* | 10/2015 | Murakami | ............ H01L 41/083 310/366 |
| 2017/0297335 A1* | 10/2017 | Takahashi | ........... H01L 41/0973 |
| 2019/0077151 A1* | 3/2019 | Hirai | ..................... B41J 2/1433 |

FOREIGN PATENT DOCUMENTS

| | | |
|---|---|---|
| CN | 102979705 | 3/2013 |
| JP | 09247781 | 9/1997 |
| JP | 2010196470 | 9/2010 |
| JP | 2010263061 | 11/2010 |
| TW | M570535 | 11/2018 |

* cited by examiner

*Primary Examiner* — Derek J Rosenau
(74) *Attorney, Agent, or Firm* — Juan Carlos A. Marquez; Marquez IP Law Office, PLLC

(57) ABSTRACT

A piezoelectric driving device includes a vibration unit, a piezoelectric element, a signal transmission layer, and a plane unit. The piezoelectric element includes a first electrode and a second electrode electrically isolated from each other. The signal transmission layer includes a first conductive zone and a second conductive zone. The first electrode of the piezoelectric element is electrically connected to the first conductive zone of the signal transmission layer, and the second electrode of the piezoelectric element is electrically connected to the second conductive zone of the signal transmission layer. The plane unit has at least one hole. The piezoelectric element, the signal transmission layer, and the plane unit are located at one side of the vibration unit and are sequentially stacked together.

10 Claims, 12 Drawing Sheets

PIEZOELECTRIC DRIVING DEVICE

CROSS-REFERENCE TO RELATED APPLICATION

This application claims the priority benefit of Taiwan application serial no. 107128143, filed on Aug. 13, 2018. The entirety of the above-mentioned patent application is hereby incorporated by reference herein and made a part of this specification.

BACKGROUND

Technical Field

The disclosure relates to a piezoelectric driving device, and more particularly to a piezoelectric driving device whose signal transmission layer electrically connected to a piezoelectric element can be better protected.

Description of Related Art

A piezoelectric pump is a new type of fluid driver, which does not require any additional driving motor and can deform a piezoelectric vibrator only by an inverse piezoelectric effect of piezoelectric ceramics, and fluid output can be realized due to the volume change of the pump chamber resulting from said deformation, or fluids can be transported through vibration of the piezoelectric vibrator. Therefore, piezoelectric pumps have gradually replaced traditional pumps and are widely used in electronics, biomedical, aerospace, automotive, and petrochemical industries.

When the piezoelectric element is bent in a positive direction, the volume of the chamber of the pump body (hereinafter referred to as the pump chamber) is increased, so that the pressure in the pump chamber is reduced to allow fluid to flow into the pump chamber from the inlet. On the other hand, when the piezoelectric element is bent in a reverse direction, the volume of the pump chamber is reduced, so that the pressure in the pump chamber is increased, and that the fluid in the pump chamber is squeezed and discharged from the outlet. At present, the signal transmission layer used to supply electricity to the piezoelectric element is often a multi-layer structure and is located outside the pump body; thus, the overall volume is large, and the structure may be easily damaged.

SUMMARY

The disclosure provides a piezoelectric driving device whose signal transmission layer electrically connected to a piezoelectric element can be better protected.

In an embodiment of the disclosure, a piezoelectric driving device includes a vibration unit, a piezoelectric element, a signal transmission layer, and a plane unit. The piezoelectric element includes a first electrode and a second electrode electrically isolated from each other. The signal transmission layer includes a first conductive zone and a second conductive zone. The first electrode of the piezoelectric element is electrically connected to the first conductive zone of the signal transmission layer, and the second electrode of the piezoelectric element is electrically connected to the second conductive zone of the signal transmission layer. The plane unit has at least one hole. The piezoelectric element, the signal transmission layer, and the plane unit are located at one side of the vibration unit and are sequentially stacked together.

According to an embodiment of the disclosure, the piezoelectric element has a first surface and a second surface opposite to each other, the first electrode and the second electrode are respectively located on the first surface and the second surface, the first surface of the piezoelectric element faces the vibration unit, the vibration unit is a conductor, and the first electrode of the piezoelectric element is electrically connected to the first conductive zone of the signal transmission layer through the vibration unit.

According to an embodiment of the disclosure, the piezoelectric driving device further includes a frame, vibration unit includes a first central zone, a first peripheral zone, and a plurality of first connection zones connected to the first central zone and the first peripheral zone, the piezoelectric element is fixed to the first central zone of the vibration unit, and the frame is fixed to the first peripheral zone of the vibration unit.

According to an embodiment of the disclosure, a surface of the frame facing the plane unit and a surface of the piezoelectric element facing the plane unit are of the same height.

According to an embodiment of the disclosure, the vibration unit includes a first central zone, a first peripheral zone, and a plurality of first connection zones connected to the first central zone and the first peripheral zone, and the first peripheral zone and the first central zone are of different heights.

According to an embodiment of the disclosure, a surface of the first peripheral zone facing the plane unit and a surface of the piezoelectric element facing the plane unit are of the same height.

According to an embodiment of the disclosure, the piezoelectric driving device further includes a transmission unit located between the piezoelectric element and the plane unit, and the transmission unit is a flexible printed circuit board (FPCB).

According to an embodiment of the disclosure, the transmission unit includes a second central zone corresponding to the piezoelectric element and a second peripheral zone located outside the second central zone, the piezoelectric element is fixed to the second central zone of the transmission unit, the second conductive zone is formed in the second central zone of the transmission unit, and the first conductive zone is formed in the second peripheral zone of the transmission unit.

According to an embodiment of the disclosure, the transmission unit further includes a protrusion located in the second central zone. The protrusion corresponds to and protrudes toward the at least one hole, and a surface of the second peripheral zone of the transmission unit facing the plane unit is coplanar with a surface of the protrusion facing the plane unit.

According to an embodiment of the disclosure, the piezoelectric driving device further includes a support member that includes a third central zone and a third peripheral zone, the third central zone of the support member is disposed between the piezoelectric element and the plane unit and forms a protrusion corresponding to the at least one hole and protruding toward the at least one hole, and the third peripheral zone of the support member is disposed between a first peripheral zone of the vibration unit and the plane unit.

According to an embodiment of the disclosure, the support member is arranged between the transmission unit and the plane unit.

According to an embodiment of the disclosure, the piezoelectric driving device further includes a fluid guiding member, the plane unit is located between the piezoelectric element and the fluid guiding member, and the fluid guiding member includes at least one through hole.

In view of the above, the piezoelectric element, the signal transmission layer, and the plane unit of the piezoelectric driving device provided in the disclosure are respectively located on the same side of the vibration unit and are sequentially stacked together. The signal transmission layer configured to be electrically connected to the first electrode and the second electrode of the piezoelectric element is formed between the vibration unit and the plane unit; that is, the signal transmission layer is formed inside the piezoelectric driving device and can be better protected.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
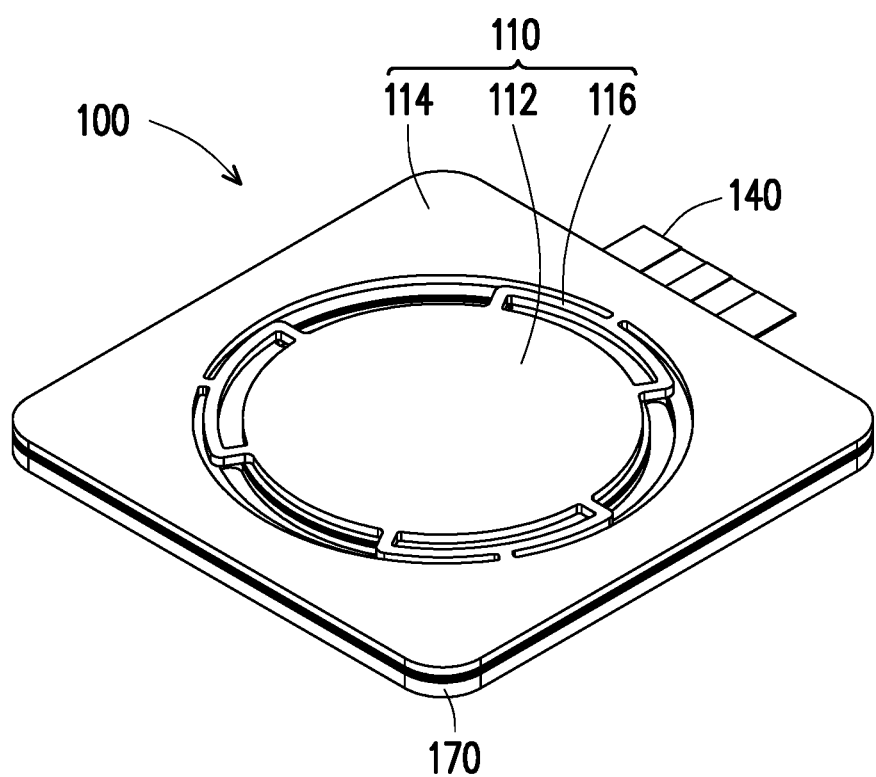
FIG. 1 is a schematic view of a piezoelectric driving device according to a first embodiment of the disclosure.
Figure 2:
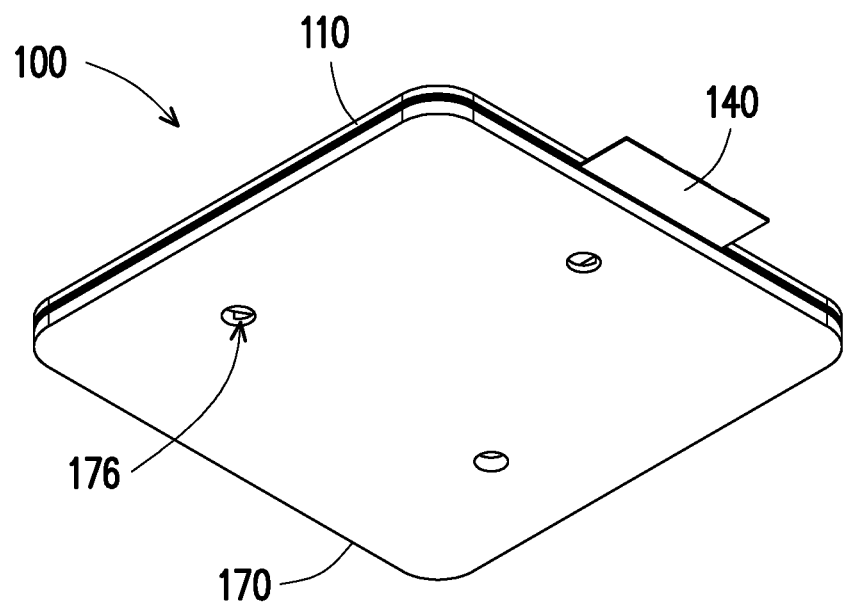
FIG. 2 is a schematic view illustrating the piezoelectric driving device in FIG. 1 at another view angle.
Figure 3:
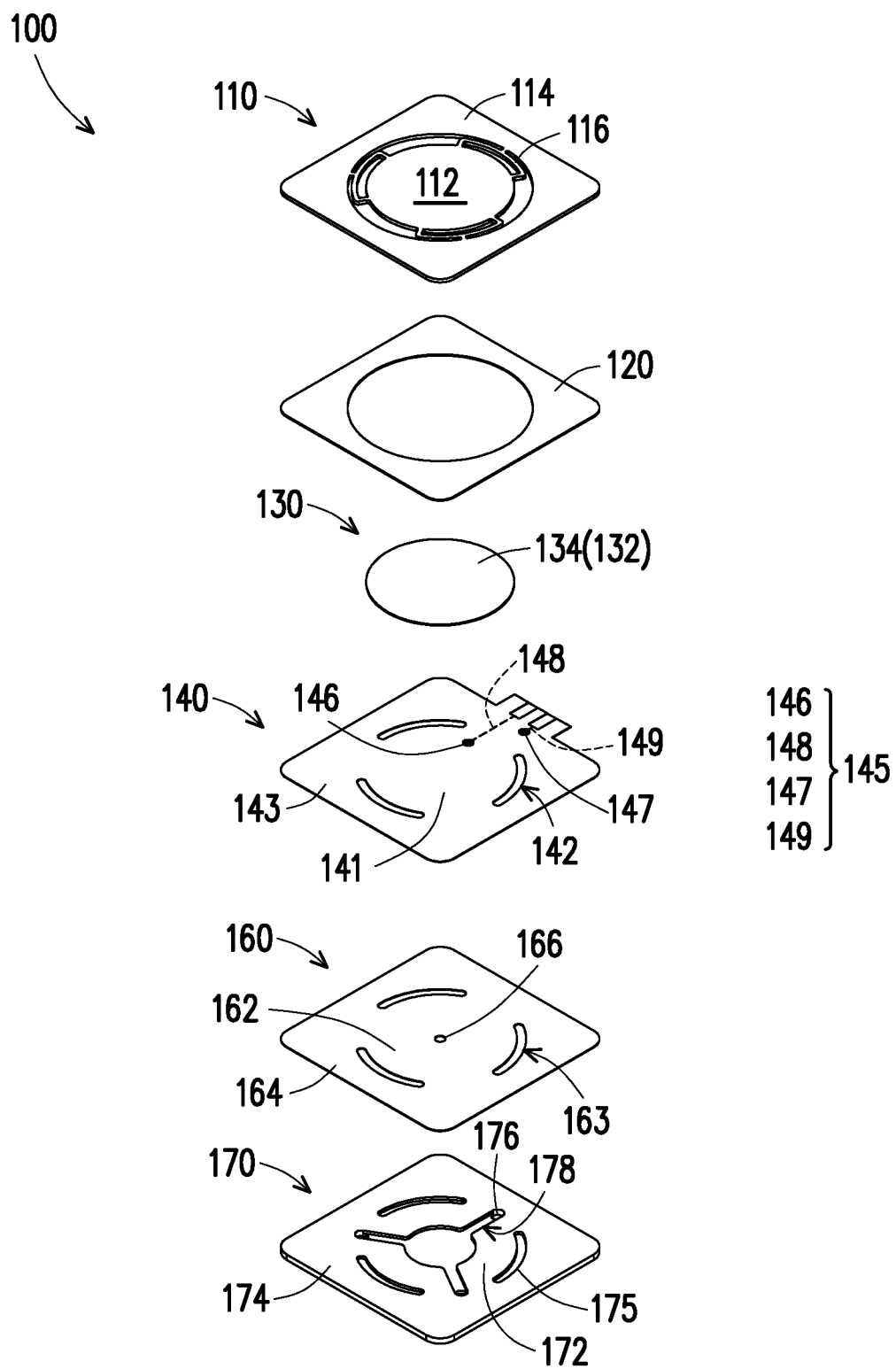
FIG. 3 is a schematic exploded view illustrating the piezoelectric driving device in FIG. 1.
Figure 4:
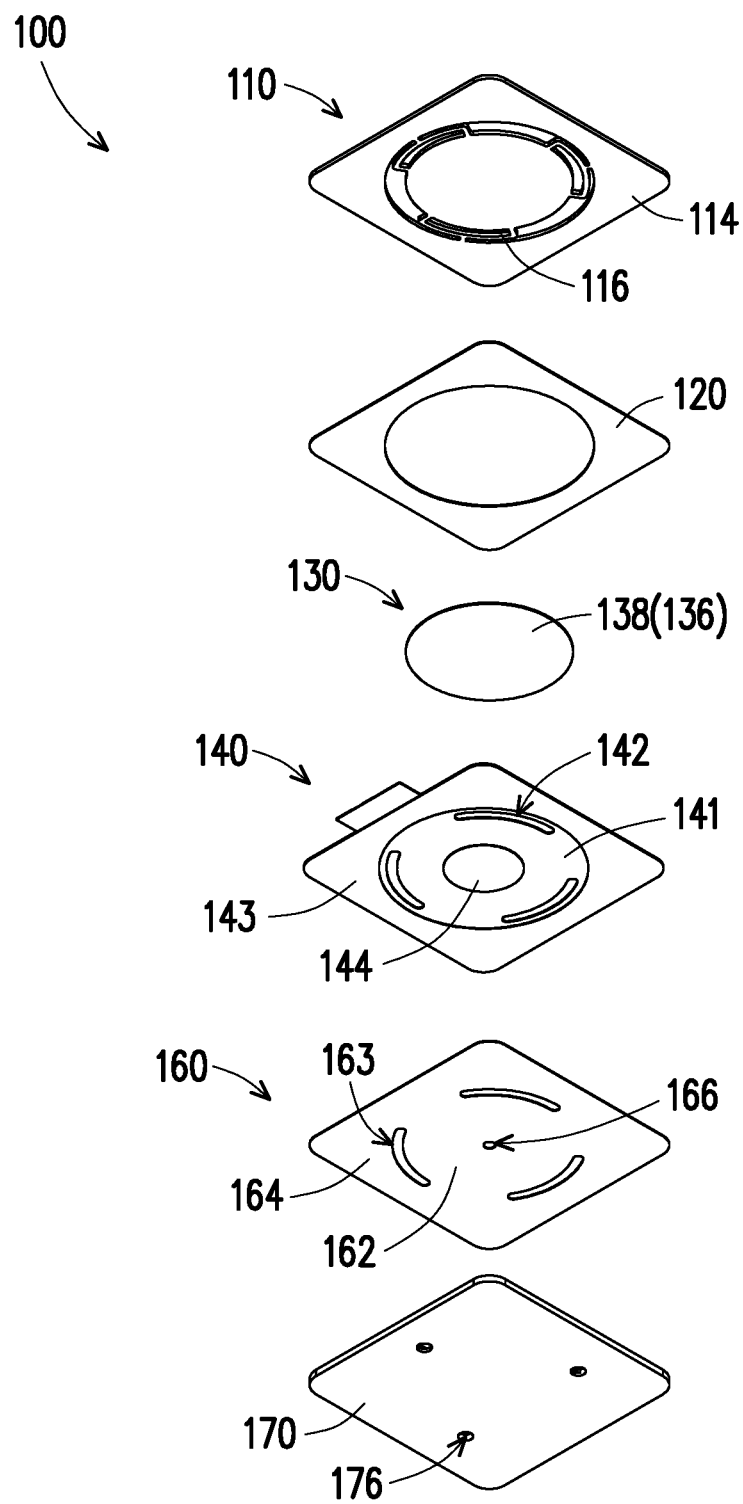
FIG. 4 is a schematic view of FIG. 3 at another view angle.
Figure 5:
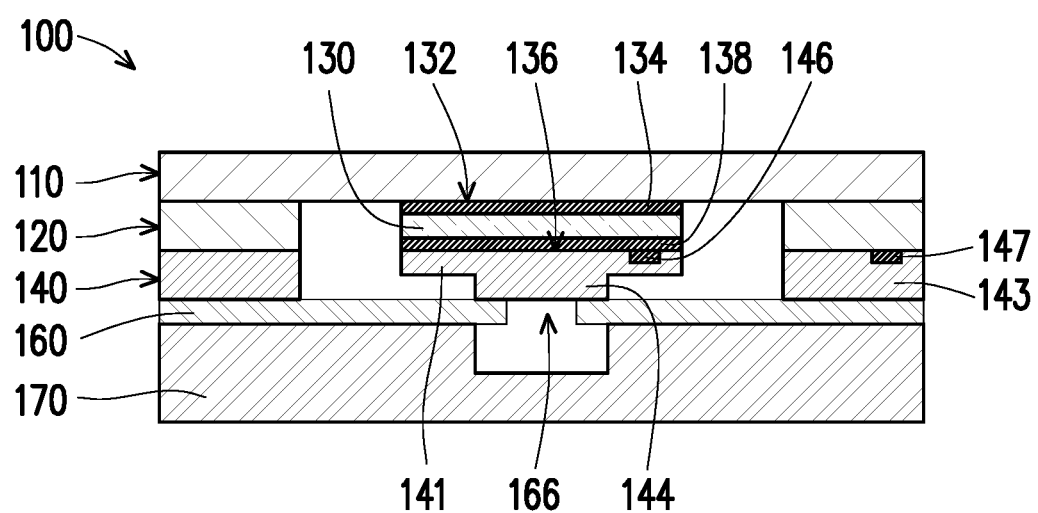
FIG. 5 is a schematic cross-sectional view illustrating the piezoelectric driving device depicted in FIG. 1.

FIG. 1 is a schematic view of a piezoelectric driving device according to a first embodiment of the disclosure. FIG. 2 is a schematic view illustrating the piezoelectric driving device in FIG. 1 at another view angle. FIG. 3 is a schematic exploded view illustrating the piezoelectric driving device in FIG. 1. FIG. 4 is a schematic view of FIG. 3 at another view angle. FIG. 5 is a schematic cross-sectional view illustrating the piezoelectric driving device depicted in FIG. 1. With reference to FIG. 1 to FIG. 5, the piezoelectric driving device 100 provided in the embodiment includes a vibration unit 110, a piezoelectric element 130, a signal transmission layer 145, and a plane unit 160. The piezoelectric driving device 100 will be described in detail below.

With reference to FIG. 3 and FIG. 4, in the present embodiment, the vibration unit 110 includes a first central zone 112, a first peripheral zone 114, and a plurality of first connection zones 116 connected to the first central zone 112 and the first peripheral zone 114. The first central zone 112 is movable relative to the first peripheral zone 114. In addition, in the embodiment, the material of the vibration unit 110 may be a metallic material, but the material of the vibration unit 110 is not limited thereto.

In the present embodiment, the piezoelectric element 130 has a first surface 132 and a second surface 136 opposite to each other and includes a first electrode 134 (shown in FIG. 3) and a second electrode 138 (shown in FIG. 4) that are electrically isolated from each other. The first electrode 134 and the second electrode 138 are respectively located on the first surface 132 and the second surface 136. One of the first electrode 134 and the second electrode 138 is a positive electrode, and the other is a negative electrode.

In the present embodiment, the first surface 132 of the piezoelectric element 130 faces the vibration unit 110. Particularly, in the present embodiment, the piezoelectric element 130 is fixed to the first central zone 112 of the vibration unit 110. When electricity is supplied to the piezoelectric element 130, the piezoelectric element 130 moves and thus can drive the first central zone 112 of the vibration unit 110 to move. In addition, in the embodiment, the shape of the piezoelectric element 130 may be a sheet shape or an arbitrary geometric shape, and the outer contour of the piezoelectric element 130 may be an arc, a polygon, a rectangle, etc. The shape of the piezoelectric element 130 is not limited in the disclosure.

In the present embodiment, the signal transmission layer 145 includes a first transmission zone 149 and a second transmission zone 148 that are electrically isolated. More specifically, in the present embodiment, the piezoelectric driving device 100 further includes a transmission unit 140 located between the piezoelectric element 130 and the plane unit 160. The transmission unit 140 is a flexible printed circuit board (FPCB). The transmission unit 140 includes a second central zone 141 surrounded by a plurality of slots 142 and corresponding to the piezoelectric element 130 and a second peripheral zone 143 located outside the second central zone 141. A first transmission zone 149 and a second transmission zone 148 are formed on the transmission unit 140, respectively. The first transmission zone 149 and the second transmission zone 148 on the transmission unit 140 are electrically isolated and insulated from each other so as to be not electrically connected to each other. In particular, the second transmission zone 148 is formed in the second central zone 141 of the transmission unit 140, and the first transmission zone 149 is formed in the second peripheral zone 143 of the transmission unit 140.

In the present embodiment, the first electrode 134 of the piezoelectric element 130 is electrically connected to the first transmission zone 149 of the signal transmission layer 145, and the second electrode 138 of the piezoelectric element 130 is electrically connected to the second transmission zone 148 of the signal transmission layer 145. As shown in FIG. 4 and FIG. 5, in the present embodiment, the second transmission zone 148 is electrically connected to the second electrode 138 of the piezoelectric element 130 through a second conductive zone 146. Besides, as shown in FIG. 3 and FIG. 5, in the present embodiment, the vibration unit 110 is a conductor, and the first electrode 134 of the piezoelectric element 130 is electrically connected to the first transmission zone 149 of the signal transmission layer 145 through the vibration unit 110.

More specifically, as shown in FIG. 3, in the present embodiment, the piezoelectric driving device 100 further includes a frame 120 located between the first peripheral zone 114 of the vibration unit 110 and the second peripheral zone 143 of the transmission unit 140. In the present embodiment, the first electrode 134 of the piezoelectric element 130 is in contact with the first central zone 112 of the vibration unit 110 having conductivity, the frame 120 is fixed to the first peripheral zone 114 of the vibration unit 110, the first conductive zone 147 of the transmission unit 140 is located at the second peripheral zone 143 of the transmission unit 140, and the first conductive zone 147 is connected to the first transmission zone 149. The frame 120 is made of a metallic material, for instance.

Said configuration allows a conductive path to be formed among the first electrode 134 of the piezoelectric element 130, the first central zone 112, the first connection zones 116, the first peripheral zone 114 of the vibration unit 110, the frame 120, the first conductive zone 147, and the first transmission zone 149. Hence, the first electrode 134 of the piezoelectric element 130 can be electrically connected to the first transmission zone 149 of the transmission unit 140.

Certainly, in other embodiments, the first transmission zone 149 and the second transmission zone 148 may also be two general-purpose wires or may be directly connected to the first electrode 134 and the second electrode 138 of the piezoelectric element 130, the first transmission zone 149 and the second transmission zone 148 are not necessarily formed on the transmission unit 140 nor formed at the same layer, and the first electrode 134 of the piezoelectric element 130 and the first transmission zone 149 need not be electrically connected by the vibration unit 110 and the frame 120. As long as the first transmission zone 149 and the second transmission zone 148 are electrically connected to the first electrode 134 and the second electrode 138 of the piezoelectric element 130, said structure should not be construed as a limitation in the disclosure.

In the present embodiment, the plane unit 160 is a valve plate, but the form of the plane unit 160 is not limited thereto. The plane unit 160 includes three arc-shaped slots 163 that surround a circular fourth central zone 162 and distinguish a fourth peripheral zone 164 outside the fourth central zone 162. The plane unit 160 further includes a hole 166 formed in the fourth central zone 162. According to the present embodiment, the location of the fourth central zone 162 corresponds to the location of the piezoelectric element 130. In other embodiments, the number and the shape of the slots 163 of the plane unit 160 should not be construed as limitations. Besides, the material of the plane unit 160 may include a metallic material or a non-conductive material, but the material of the plane unit 160 should not be limited to the material provided herein.

In addition, as shown in FIG. 3, in the present embodiment, the piezoelectric driving device 100 further includes a fluid guiding member 170, and the plane unit 160 is located between the piezoelectric element 130 and the fluid guiding member 170. In this embodiment, the fluid guiding member 170 includes a fifth central zone 172 surrounded by a plurality of grooves 175 and corresponding to the piezoelectric element 130, a fifth peripheral zone 174 located outside the fifth central zone 172, three through holes 176 penetrating the fluid guiding member 170, and three flow paths 178 respectively communicating with the three through holes 176. Certainly, the number of the through holes 176 and the flow paths 178 of the fluid guiding member 170 are not limited thereto.

In the present embodiment, the fifth peripheral zone 174 of the fluid guiding member 170 is attached to the fourth peripheral zone 164 of the plane unit 160, and the fourth central zone 162 of the plane unit 160 is movable relative to the fourth peripheral zone 164. Besides, in this embodiment, the material of the fluid guiding member 170 may be a metallic material, which should however not be construed as a limitation in the disclosure.

In the present embodiment, note that the piezoelectric element 130, the signal transmission layer 145, and the plane unit 160 are located at the same side of the vibration unit 110 and are sequentially stacked together. That is, in the present embodiment, the piezoelectric element 130 and the signal transmission layer 145 are located between the vibration unit 110 and the plane unit 160. Since the signal transmission layer 145 is mainly formed within the piezoelectric driving device 100, the signal transmission layer 145 of the piezoelectric driving device 100 provided in the present embodiment can be better protected.

Besides, in the present embodiment, it can be observed from FIG. 5 that a surface of the frame 120 facing the plane unit 160 is coplanar with a surface of the piezoelectric element 130 facing the plane unit 160. The lower surface of the frame 120 is aligned to the lower surface of the piezoelectric element 130; therefore, during the assembling process, the transmission unit 140 can be adhered to the lower surface of the frame 120 and the lower surface of the piezoelectric element 130 at one time rather than at several times. As such, the assembling process is relatively convenient, and the flatness of the transmission unit 140 can be guaranteed.

It can be learned from FIG. 5 that the transmission unit 140 provided in the present embodiment includes a protrusion 144 located in the second central zone 141, and the protrusion 144 of the transmission unit 140 corresponds to and protrudes toward the hole 166. In the present embodiment, the transmission unit 140 has different thicknesses, and a surface (the lower surface) of the second peripheral zone 143 of the transmission unit 140 facing the plane unit 160 is coplanar with a surface (the lower surface) of the protrusion 144 facing the plane unit 160. As such, after the piezoelectric driving device 100 is completely assembled, the protrusion 144 of the transmission unit 140 can push against a portion of the plane unit 160 near the hole 166, so as to ensure that at a certain moment of actuation (e.g., at the time shown in FIG. 5), the protrusion 144 pushes against the hole 166, such that fluid (not shown) does not pass through the hole 166. Since the protrusion 144 and the second peripheral zone 143 of the transmission unit 140 can be formed at the same stage in the manufacturing process, the protrusion 144 and the second peripheral zone 143 of the transmission unit 140 can have the same thickness, so as to reduce the tolerance.

In the piezoelectric driving device 100 provided in the present embodiment, note that the signal transmission layer 145 electrically connected to the piezoelectric element 130 is disposed on one single transmission unit 140 located between the vibration unit 110 and the plane unit 160. Since the signal transmission layer 145 is formed on one single transmission unit 140, the overall thickness of the piezoelectric driving device 100 provided in the present embodiment is smaller than that of the conventional piezoelectric driving device having a plurality of signal transmission layers, and the piezoelectric driving device 100 provided in the present embodiment can be easily assembled. Besides, the transmission unit 140 is mainly located within the piezoelectric driving device 100 and thus provides better protection for the signal transmission layer 145.

Other types of piezoelectric driving devices 100a, 100b, and 100c will be described below. The same or similar elements provided in the following embodiment and the previous embodiment will be denoted by the same or similar reference numerals and will not be described again, but the main differences between these embodiments will be explained below.

Figure 6:
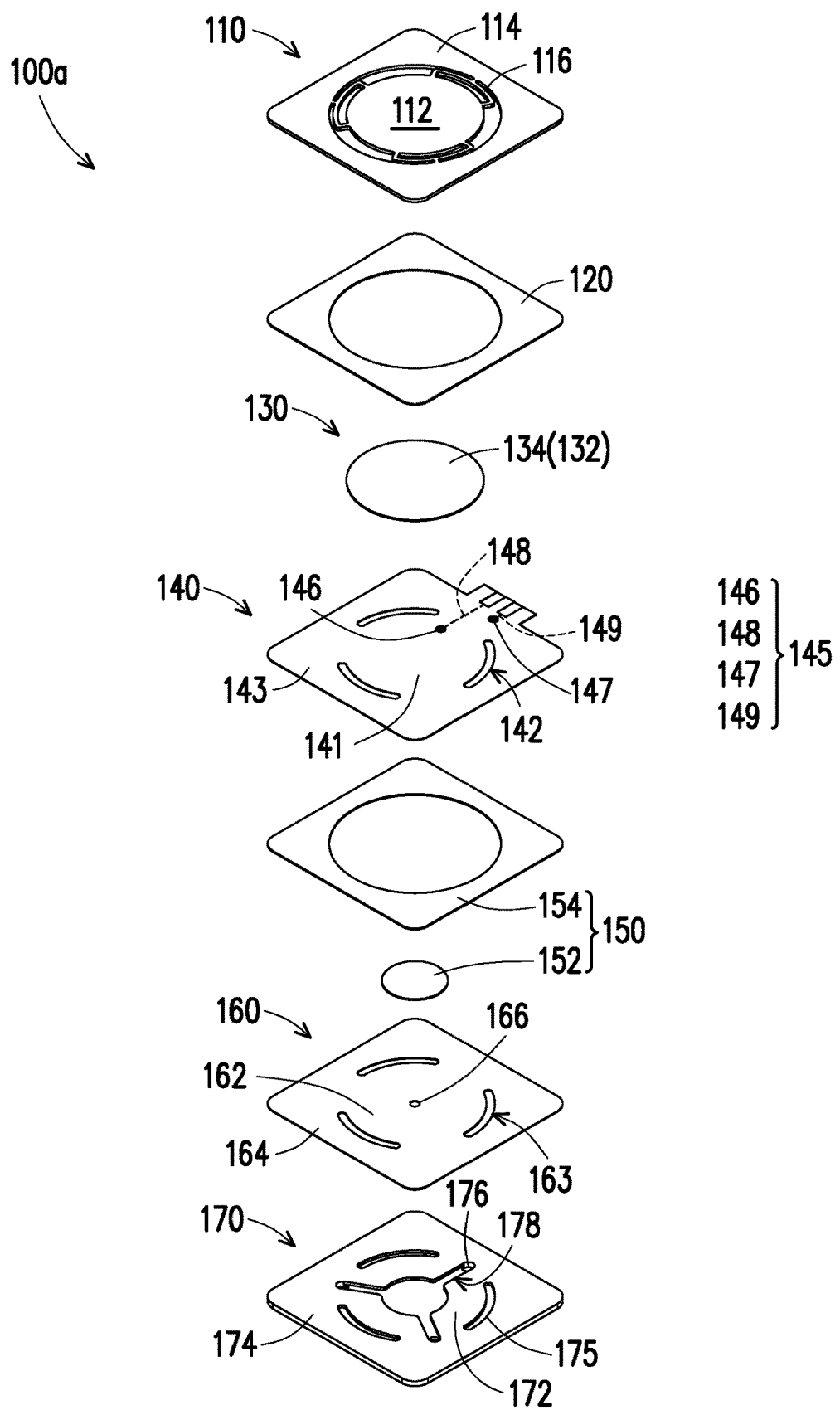
FIG. 6 is a schematic exploded view of a piezoelectric driving device according to a second embodiment of the disclosure.
Figure 7:
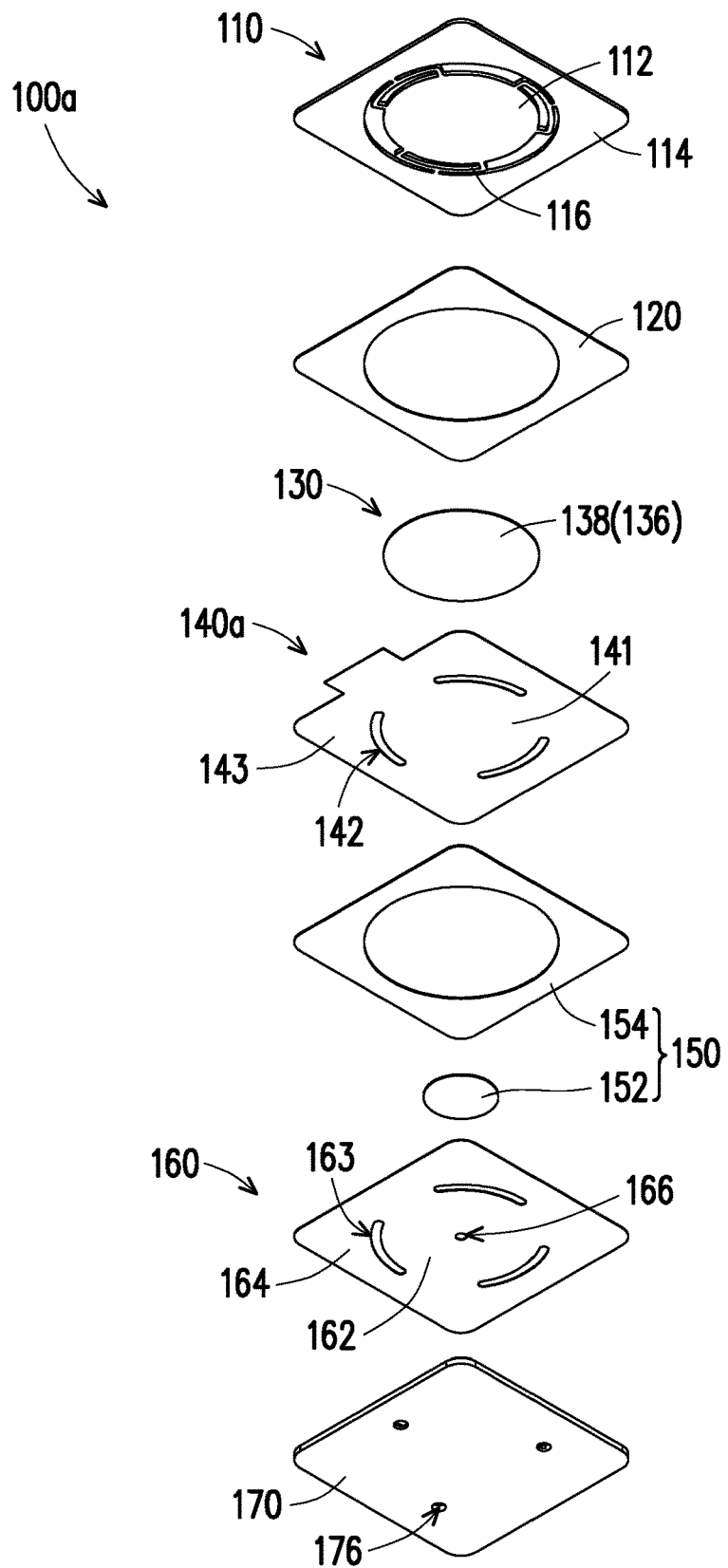
FIG. 7 is a schematic view illustrating the piezoelectric driving device in FIG. 6 at another view angle.
Figure 8:
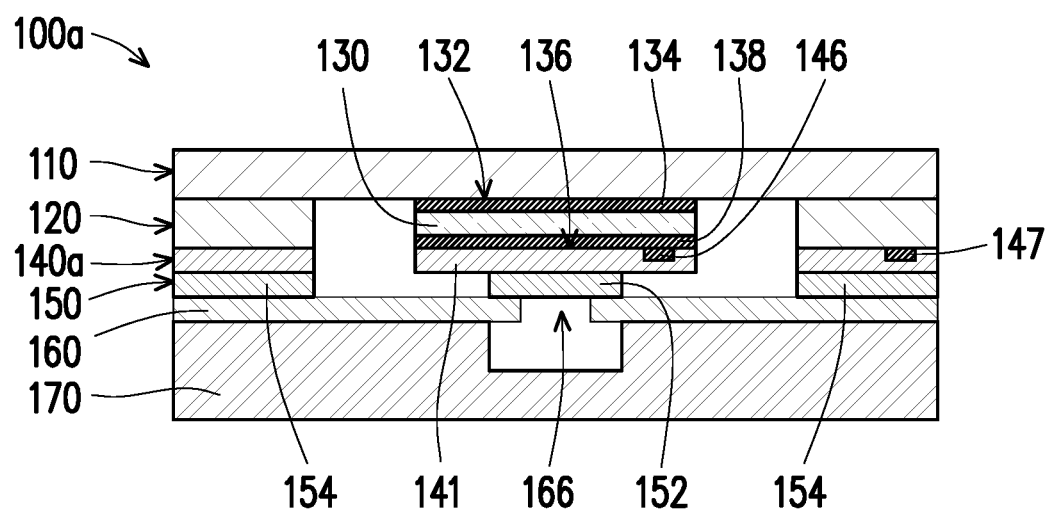
FIG. 8 is a schematic cross-sectional view illustrating the piezoelectric driving device depicted in FIG. 6.

FIG. 6 is a schematic exploded view of a piezoelectric driving device according to another embodiment of the disclosure. FIG. 7 is a schematic view illustrating the piezoelectric driving device in FIG. 6 at another view angle. FIG. 8 is a schematic cross-sectional view illustrating the piezoelectric driving device depicted in FIG. 6. With reference to FIG. 6 to FIG. 8, the main difference between the piezoelectric driving device 100a provided in the embodiment and the piezoelectric driving device 100 provided in the previous embodiment lies in that the transmission unit 140 shown in FIG. 5 has different thicknesses; specifically, the second central zone 141 of the transmission unit 140 has two thicknesses. The thickness of the protrusion 144 of the transmission unit 140 configured to push against the plane unit 160 is greater than the thickness of other portion of the second central zone 141, and the thickness of the protrusion 144 of the transmission unit 140 is the same as the thickness of the second peripheral zone 143, so that the lower surface of the protrusion 144 of the transmission unit 140 is aligned to the lower surface of the second peripheral zone 143 of the transmission unit 140.

In the present embodiment, as shown in FIG. 8, the thickness of the second central zone 141 of the transmission unit 140a is the same as the thickness of the second peripheral zone 143 (shown in FIG. 7), and the piezoelectric driving device 100a further includes a support member 150. The support member 150 is disposed between the transmission unit 140a and the plane unit 160. The support member 150 includes a third central zone 152 and a third peripheral zone 154. The third central zone 152 of the support member 150 is disposed between the piezoelectric element 130 and the plane unit 160 as a protrusion 144 corresponding to the hole 166 and protruding toward the hole 166. The third peripheral zone 154 of the support member 150 is disposed between the first peripheral zone 114 of the vibration unit 110 and the plane unit 160.

In the present embodiment, the protrusion configured to push against the hole 166 is provided by the third central zone 152 of the support member 150, and the thickness of the third central zone 152 of the support member 150 is the same as the thickness of the third peripheral zone 154. The third central zone 152 and the third peripheral zone 154 of the support member 150 can be formed by the same piece of material, and thus the manufacturing process is rather simple. According to the present embodiment, the thickness of the second central zone 141 of the transmission unit 140a is the same as the thickness of the second peripheral zone 143, the manufacturing process of the transmission unit 140a is also simple.

Figure 9:
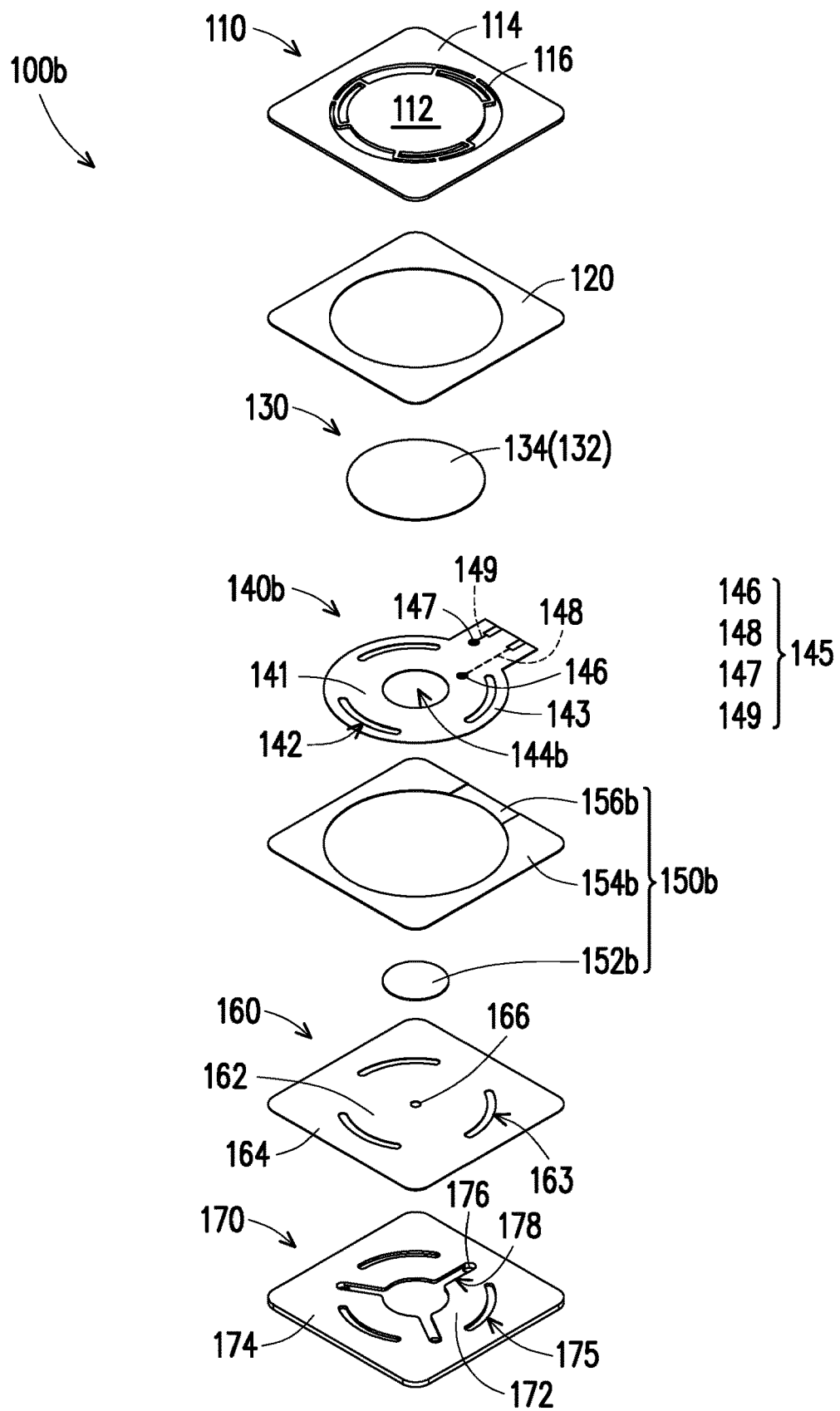
FIG. 9 is a schematic exploded view of a piezoelectric driving device according to a third embodiment of the disclosure.
Figure 10:
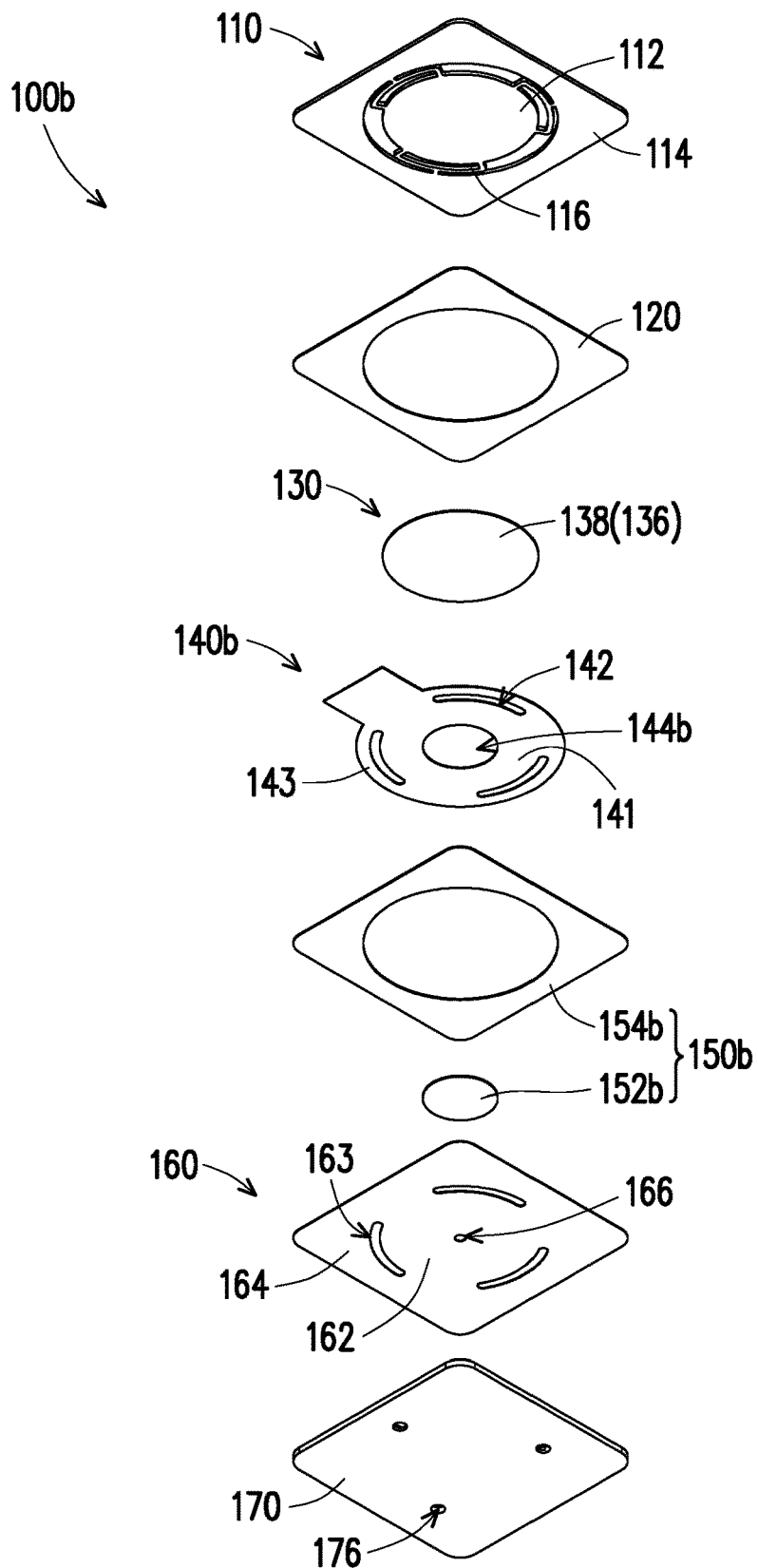
FIG. 10 is a schematic view illustrating the piezoelectric driving device in FIG. 9 at another view angle.
Figure 11:
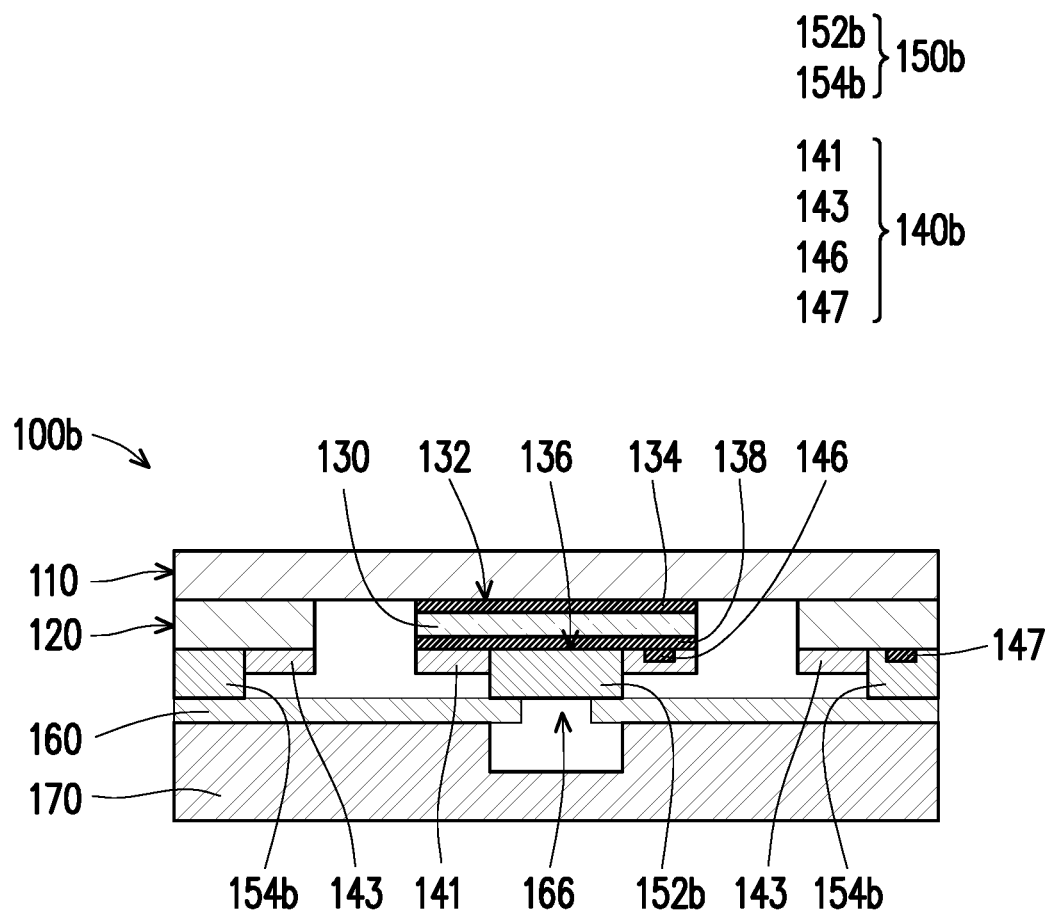
FIG. 11 is a schematic cross-sectional view illustrating the piezoelectric driving device depicted in FIG. 9.

FIG. 9 is a schematic exploded view of a piezoelectric driving device according to another embodiment of the disclosure. FIG. 10 is a schematic view illustrating the piezoelectric driving device in FIG. 9 at another view angle. FIG. 11 is a schematic cross-sectional view illustrating the piezoelectric driving device depicted in FIG. 9. With reference to FIG. 9 to FIG. 11, the main difference between the piezoelectric driving device 100b provided in the present embodiment and the piezoelectric driving device 100a provided in the embodiment shown in FIG. 8 lies in that the second central zone 141 of the transmission unit 140a provided in the previous embodiment is shaped as a circular plate and has no opening allowing the third central zone 152 of the support member 150 to pass through, and the distribution area of the third peripheral zone 154 of the support member 150 corresponds to the distribution area of the second peripheral zone 143 of the transmission unit 140a. That is, in the previous embodiment, the third central zone 152 of the support member 150 is stacked onto the second central zone 141 of the transmission unit 140a, and the third peripheral zone 154 of the support member 150 is stacked onto the second peripheral zone 143 of the transmission unit 140a.

In the present embodiment, the second central zone 141 of the transmission unit 140b has an opening 144b, and an aperture of the opening 144b is greater than or equal to ($\geq$) the diameter of the third central zone 152b of the support member 150b, so as to allow the third central zone 152b of the support member 150b to pass through. Besides, the outer diameter of the second peripheral zone 143 of the transmission unit 140b is smaller than the inner diameter of the third peripheral zone 154b of the support member 150b, and the transmission unit 140b can be located within the third peripheral zone 154b of the support member 150b and is mostly not overlapped with the support member 150b.

As shown in FIG. 9, in the present embodiment, note that the third peripheral zone 154b of the support member 150b has a concave portion 156b for holding one portion of the transmission unit 140b, and the thickness of the concave portion 156b of the third peripheral zone 154b of the support member 150b is smaller than the thickness of other portions of the support member 150b. Accordingly, the reduced thickness at the concave portion 156b is substantially the same as the thickness of the transmission unit 140b. Certainly, in other embodiments, there may be no structure located at the region corresponding to the concave portion 156 of the support member 150b to allow one portion of the transmission unit 140b to pass through, that is, the support member does not have the concave portion; however, the type of the support member 150b is not limited thereto.

As shown in FIG. 11, the protrusion configured to push against the hole 166 as described in the present embodiment is provided by the third central zone 152b of the support member 150b, and the third central zone 152b and the third peripheral zone 154 of the support member 150b can be formed by the same piece of material, so as to ensure that the thickness of the third central zone 152b is equal to the thickness of the third peripheral zone 154b. Besides, in the present embodiment, the thickness of the second central zone 141 of the transmission unit 140b is the same as the thickness of the second peripheral zone 143, and thus the manufacturing process is rather simple.

Figure 12:
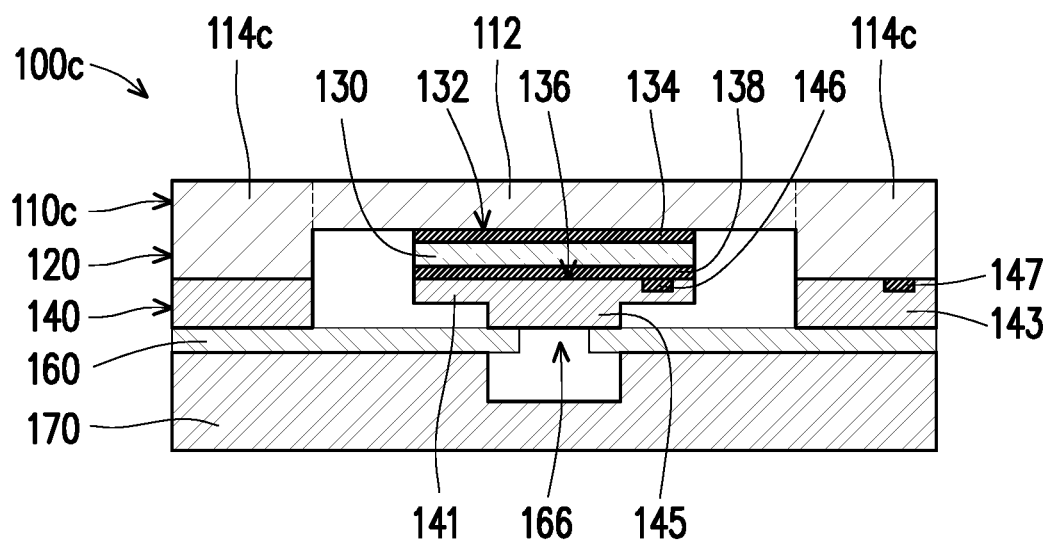
FIG. 12 is a schematic cross-sectional view of a piezoelectric driving device according to a fourth embodiment of the disclosure.

FIG. 12 is a schematic cross-sectional view of a piezoelectric driving device according to another embodiment of the disclosure. With reference to FIG. 12, the main difference between the piezoelectric driving device 100c provided in the present embodiment and the piezoelectric driving device 100 depicted in FIG. 5 lies in that the piezoelectric driving device 100 shown in FIG. 5 has a frame 120 disposed in the first peripheral zone 114 of the vibration unit 110, and the lower surface of the piezoelectric element 130 facing the plane unit 160 is aligned to the lower surface of the frame 120.

In the present embodiment, the vibration unit 110c is similar to the combination of the vibration unit 110 and the frame 120 depicted in FIG. 5. Hence, in the present embodiment, the thickness of the first peripheral zone 114c of the vibration unit 110c is greater than the thickness of the first central zone 112 of the vibration unit 110c. A surface of the first peripheral zone 114c facing the plane unit 160 is coplanar with a surface of the piezoelectric element 130 facing the plane unit 160. Thereby, the number of components of the piezoelectric driving device 100c is relatively small, which ensures that the assembling process is simple, and that the piezoelectric driving device 100c has a relatively small tolerance.

To sum up, the piezoelectric element, the signal transmission layer, and the plane unit of the piezoelectric driving device provided in the disclosure are respectively located on the same side of the vibration unit. The signal transmission layer configured to be electrically connected to the first electrode and the second electrode of the piezoelectric element is formed between the vibration unit and the plane unit; that is, the signal transmission layer is mostly formed inside the piezoelectric driving device and can be better protected. In addition, in an embodiment, the signal transmission layer is formed in one layer and can be formed at the same transmission unit, for instance. Thereby, the number of components of the piezoelectric driving device is relatively mall, the number of layers of the piezoelectric driving device is also small, the assembly process is relatively simple and convenient, and the overall tolerance can be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A piezoelectric driving device comprising:
a vibration unit;
a piezoelectric element comprising a first electrode and a second electrode electrically isolated from each other;
a signal transmission layer comprising a first conductive zone and a second conductive zone, the first electrode of the piezoelectric element being electrically connected to the first conductive zone of the signal transmission layer, the second electrode of the piezoelectric element being electrically connected to the second conductive zone of the signal transmission layer; and
a plane unit having at least one hole, wherein the piezoelectric element, the signal transmission layer, and the plane unit are located at one side of the vibration unit and sequentially stacked together;
a transmission unit located between the piezoelectric element and the plane unit, the transmission unit being a flexible printed circuit board;
wherein the transmission unit comprises a protrusion located in the second central zone, the protrusion corresponds to and protrudes toward the at least one hole, and a surface of the second peripheral zone of the transmission unit facing the plane unit is coplanar with a surface of the protrusion facing the plane unit.

2. The piezoelectric driving device of claim 1, wherein the piezoelectric element has a first surface and a second surface opposite to each other, the first electrode and the second electrode are respectively located on the first surface and the second surface, the first surface of the piezoelectric element faces the vibration unit, the vibration unit is a conductor, and the first electrode of the piezoelectric element is electrically connected to the first conductive zone of the signal transmission layer through the vibration unit.

3. The piezoelectric driving device of claim 1, further comprising: a frame, the vibration unit comprising a first central zone, a first peripheral zone, and a plurality of first connection zones connected to the first central zone and the first peripheral zone, the piezoelectric element being fixed to the first central zone of the vibration unit, the frame being fixed to the first peripheral zone of the vibration unit.

4. The piezoelectric driving device of claim 3, wherein a surface of the frame facing the plane unit is coplanar with a surface of the piezoelectric element facing the plane unit.

5. The piezoelectric driving device of claim 1, wherein the vibration unit comprises a first central zone, a first peripheral zone, and a plurality of first connection zones connected to the first central zone and the first peripheral zone, and a thickness of the first peripheral zone is greater than a thickness of the first central zone.

6. The piezoelectric driving device of claim 5, wherein a surface of the first peripheral zone facing the plane unit is coplanar with a surface of the piezoelectric element facing the plane unit.

7. The piezoelectric driving device of claim 1, wherein the transmission unit comprises a second central zone corresponding to the piezoelectric element and a second peripheral zone located outside the second central zone, the second conductive zone is formed in the second central zone of the transmission unit, and the first conductive zone is formed in the second peripheral zone of the transmission unit.

8. The piezoelectric driving device of claim 1, further comprising: a support member comprising a third central zone and a third peripheral zone, the third central zone of the support member being disposed between the piezoelectric element and the plane unit and forming a protrusion corresponding to the at least one hole and protruding toward the at least one hole, the third peripheral zone of the support member being disposed between a first peripheral zone of the vibration unit and the plane unit.

9. The piezoelectric driving device of claim 8, wherein the support member is disposed between the transmission unit and the plane unit.

10. The piezoelectric driving device of claim 1, further comprising: a fluid guiding member, the plane unit being located between the piezoelectric element and the fluid guiding member, the fluid guiding member comprising at least one through hole.

* * * * *